(12) United States Patent
Lauter et al.

(10) Patent No.: US 6,429,718 B1
(45) Date of Patent: Aug. 6, 2002

(54) COMPUTER TOMOGRAPH WITH A MULTI-STAGE CHARGE-INTEGRATED READ AMPLIFIER

(75) Inventors: Josef Lauter, Geilenkirchen; Stefan Schneider; Herfried K. Wieczorek, both of Aachen, all of (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/469,334

(22) Filed: Dec. 22, 1999

(30) Foreign Application Priority Data

Dec. 22, 1998 (EP) .............................. 98204389

(51) Int. Cl.[7] .............................. G06F 7/64; G06G 7/18; G06G 7/19
(52) U.S. Cl. .......................... 327/336; 330/278; 378/4; 378/19
(58) Field of Search .................... 330/86, 110, 254, 330/278, 282; 327/336, 337, 554, 555; 378/19, 4

(56) References Cited

U.S. PATENT DOCUMENTS

| 4,438,354 | A | | 3/1984 | Haque et al. ................ 307/493 |
|---|---|---|---|---|
| 4,441,082 | A | * | 4/1984 | Haque ........................ 330/129 |
| 4,815,118 | A | | 3/1989 | Acharya et al. .............. 378/19 |
| 5,363,055 | A | | 11/1994 | Ribner .......................... 330/9 |
| 5,450,622 | A | * | 9/1995 | Vandegraaf .................. 455/222 |
| 5,892,540 | A | * | 4/1999 | Kozolowski et al. ........ 348/300 |
| 6,084,467 | A | * | 7/2000 | Muza ........................... 330/69 |
| 6,292,528 | B1 | * | 9/2001 | Wieczorek et al. .......... 378/19 |
| 6,324,244 | B1 | * | 11/2001 | Lauter et al. ................. 378/19 |

* cited by examiner

Primary Examiner—Toan Tran
Assistant Examiner—Quan Tra
(74) Attorney, Agent, or Firm—John Vodopia

(57) ABSTRACT

The invention relates to a computer tomograph provided with a charge-integrating read amplifier having a plurality of gain factors for a data acquisition system as well as a control circuit for the gain factor. In order to avoid noise in addition to the shot noise in computer tomographs of this kind and also to avoid degrading of the DQE (Detection Quantum Efficiency), according to the invention it is proposed that the control circuit automatically selects the gain factor in dependence on the expected integrated input signal of the next frame, the expectation being based on the maximum possible relative variation of the integrated input signal between two successive frames.

8 Claims, 3 Drawing Sheets

COMPUTER TOMOGRAPH WITH A MULTI-STAGE CHARGE-INTEGRATED READ AMPLIFIER

BACKGROUND OF THE INVENTION

The invention relates to a computer tomograph with a charge-integrating read amplifier having a plurality of gain factors for a data acquisition system as well as a control circuit for the gain factors.

U.S. Pat. No. 5,363,055 discloses a programmable read amplifier with a plurality of gain factors for a data acquisition system of a computer tomograph. The read amplifier includes an operational amplifier with an inverting input, a non-inverting input and an output as well as a plurality of capacitors which can be connected parallel to the operational amplifier, between the inverting input and the output of the operational amplifier, by means of switches.

Those skilled in the art will understand that the term "frame" as used herein in its conventional manner refers to a complete shot of CT data from one exposure. For example, in a CT detection scheme which utilizes 1000 detectors, one frame would comprise one thousand parts of data derived respectively from each of the 1000 detectors for 1 shot period (i.e., exposure). A typical shot period is around a millisecond.

A reset switch first short-circuits all parallel connected capacitors in order to remove residual charges from the capacitors before application of an input signal from a photodiode to the input of the amplifier. Subsequently, the accumulated charge of the photodiode is applied to the input of the amplifier and transferred to the parallel connected capacitors. Finally, individual switches are actuated by a controller in order to connect the capacitors to the reference potential and to transfer their charge to the other parallel capacitors. As a result of this step, the gain factor is controlled so as to reduce the necessary resolution of the subsequent analog-to-digital converter.

It is a drawback of the known read amplifier that all capacitors are connected in parallel during the transfer of the charge of the photodiode. This results in a very high capacitance parallel to the operational amplifier, causing additional noise in the read amplifier. If subsequently individual capacitors are connected to the reference potential, a further noise (kTC noise) occurs in the read amplifier.

Starting from this state of the art, it is an object of the invention to provide a computer tomograph of the kind set forth in which noise additional to the shot noise is avoided and in which, in comparison with the required overall dynamic range of the read amplifier, a smaller local dynamic range is feasible in the individual amplifier stages, without the DQE (Detection Quantum Efficiency) being degraded.

The shot noise of the signal arises from the square root thereof. The local dynamic range in the individual amplifier stages of the read amplifier, therefore, could correspond to the signal-to-noise ratio for the highest signal if the signal of the next frame were known exactly in advance. The invention utilizes the fact that the input signal of a computer tomograph varies only slowly between successive frames and that information as regards the next signal can be extracted therefrom.

SUMMARY OF THE INVENTION

This object is specifically achieved in a computer tomograph according to the invention in that the control circuit automatically selects the gain factor in dependence on the expected integrated input signal of the next frame, the expectation being based on the maximum possible relative variation of the integrated input signal between two successive frames.

The choice between two or more gain factors of. the read amplifier is preferably made by comparison of the integrated input signal with reference values as described in claim 2. Reliable operation with full resolution of the signal and the shot noise is ensured when the reference values are determined in conformity with claim 3.

Claim 4 discloses an advantageous circuit arrangement of a read amplifier for a computer tomograph. In the case of an amplifier having only two gain factors, the circuitry for the control of the read amplifier can be formed by means of a threshold switch having two stable states, notably a Schmitt trigger, and an inverter.

When use is made of CMOS technology, the read amplifier can be arranged in the direct vicinity of a photosensor (pixel) of the computer tomograph which supplies the input signal.

BRIEF DESCRIPTION OF THE DRAWINGS

The invention will be described in detail hereinafter, by way of example, with reference to the Figures. Therein.

The wide dynamic range of the input signal constitutes one of the major problems in computer tomographs.

Figure 4:
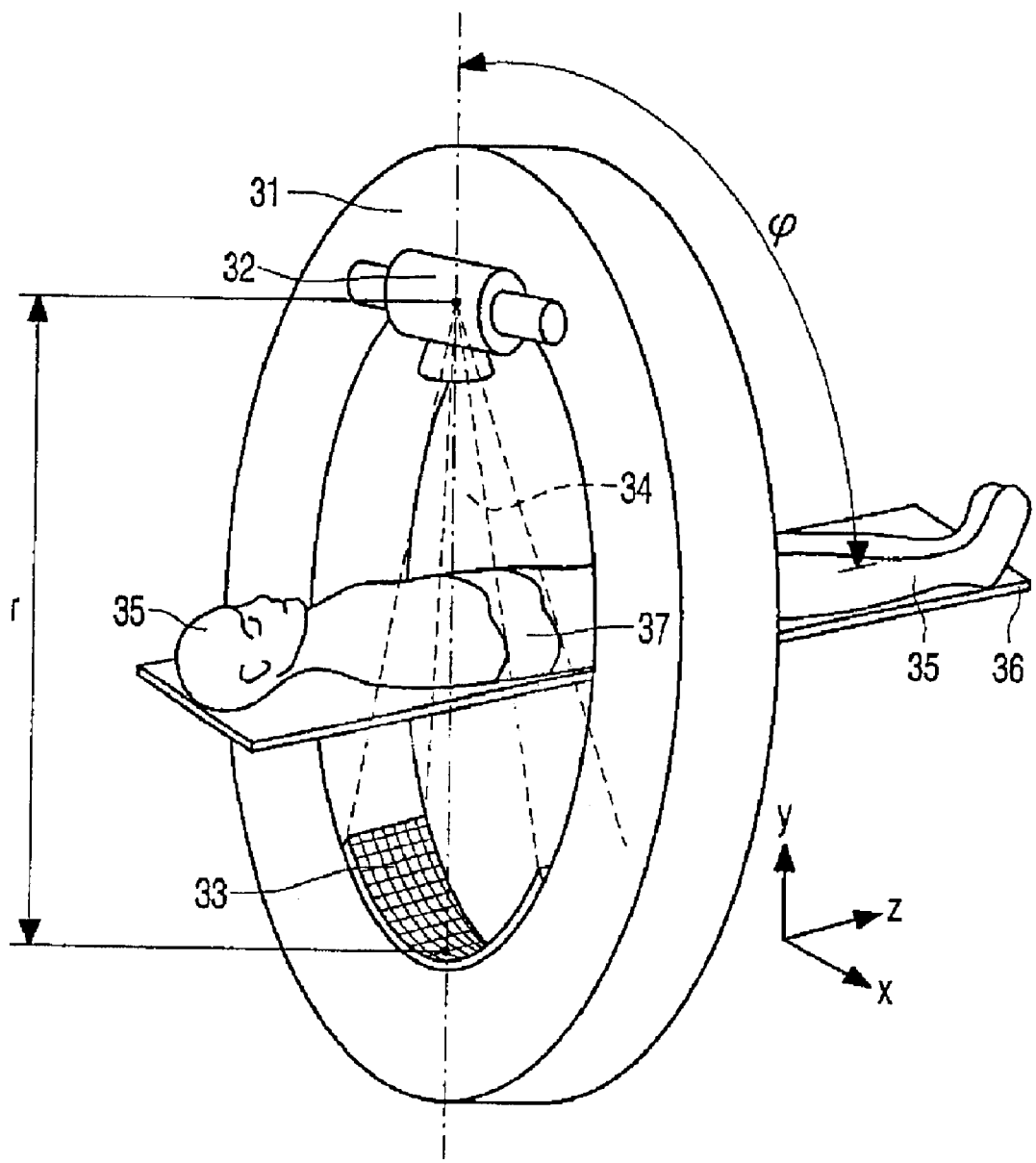

FIG. 4 shows diagrammatically a computer tomograph with a multi-line detector.

DETAILED DESCRIPTION OF THE PREFERRED EMBODIMENTS

Figure 1:
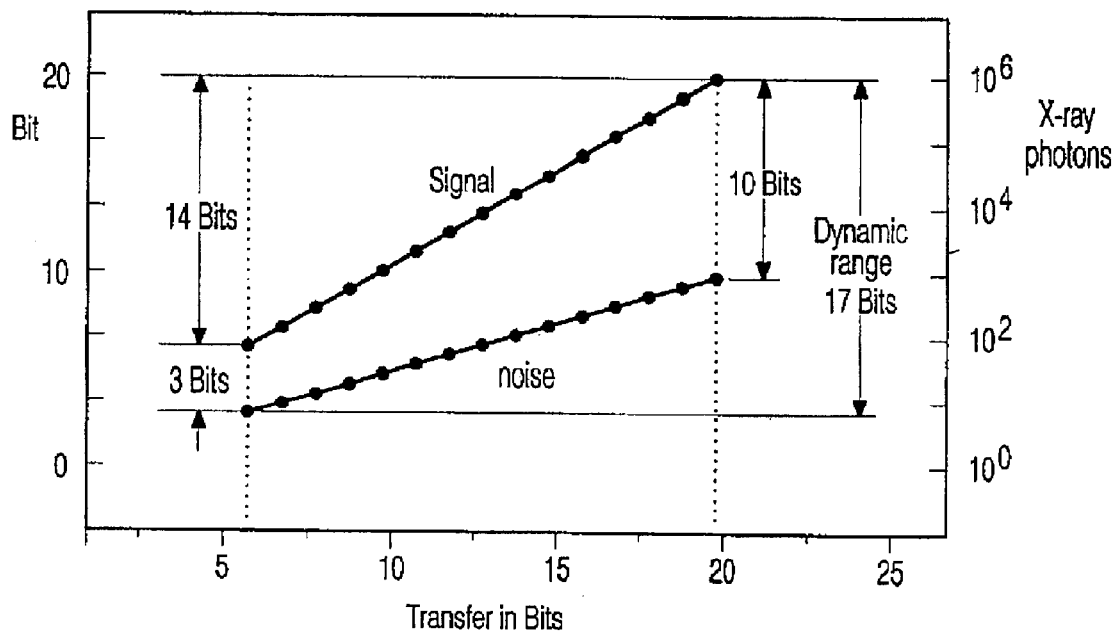
FIG. 1 shows the logarithmated number of X-ray photons and the shot noise in bits as a function of the transferred photons.

FIG. 1 illustrates that the number of X-ray photons fluctuates by a factor of 16,000 from the lowest signal (64 photons) to the highest signal (approximately one million photons). This corresponds to approximately 14 bits.

The shot noise of the signal results from the square root thereof. Therefore, the resolution of the signal is dependent on its amplitude. For the highest signal shown in FIG. 1 the signal-to-noise ratio amounts to 10 bits whereas the signal-to-noise ratio of the smallest signal amounts to 3 bits only.

FIG. 1 shows that an overall dynamic range of 17 bits is required in order to ensure amplification of the smallest noise signal (8 photons) and the highest signal (approximately one million photons). In order to enable the required read amplifier to be arranged in the direct vicinity of the photosensors, as is the case, for example in multi-line detectors, a CMOS technique or a comparable integration technique must be used. However, the dynamic range of 17 bits shown in FIG. 1 can then hardly be implemented at acceptable cost. Therefore, according to the invention recourse is made to a charge-integrating read amplifier with a plurality of gain factors. Each amplifier stage, having its own gain factor, covers a local dynamic range which is smaller than the overall dynamic range of the read amplifier.

Figure 2:
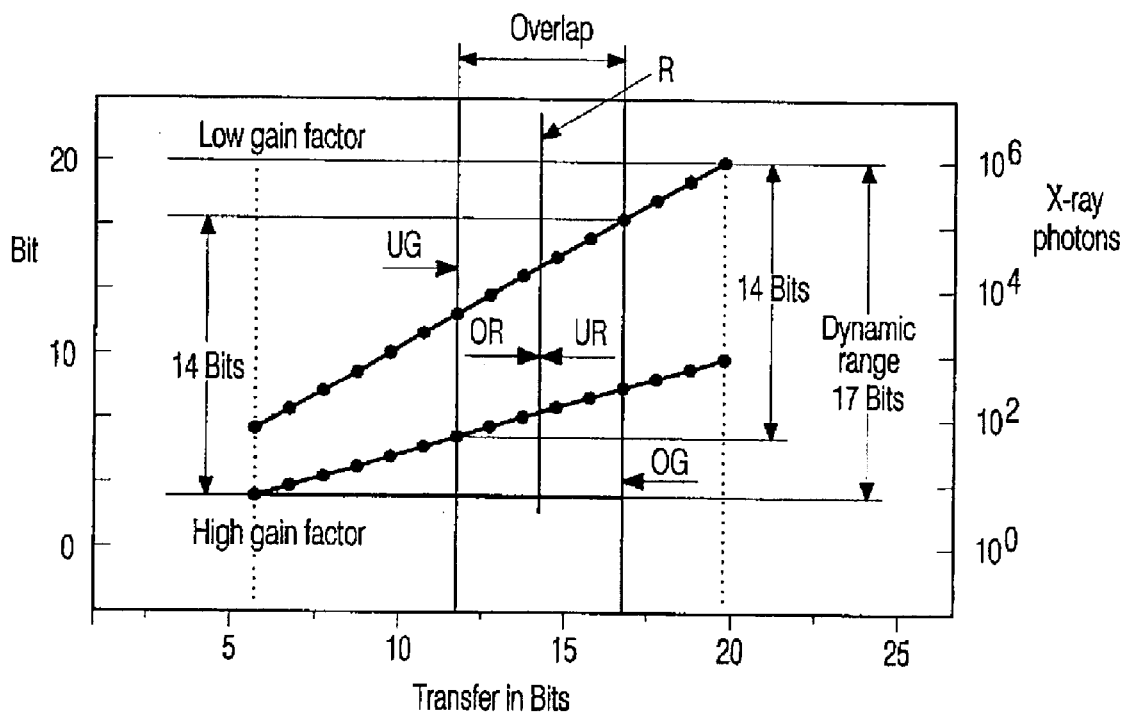
FIG. 2 shows a diagram of the kind shown in FIG. 1 for a read amplifier with two gain factors and overlapping local dynamic ranges of the two amplifier stages.

FIG. 2 shows a signal and noise signal variation which corresponds to FIG. 1 and requires an overall dynamic range of 17 bits for the read amplifier. This overall dynamic range is covered by means of two amplifier stages having a high and a low gain factor, each amplifier stage having a respective local dynamic range of 14 bits.

As has already been stated, the input signal varies only slowly between two successive frames. Consequently, the maximum possible relative variation of the integrated input signal ΔS/S between two successive frames is also limited. This fact is utilized by the invention to select, in dependence on the expected integrated input signal of the next frame, the gain factor whose local dynamic range is definitely suitable for resolving the expected input signal.

In order to ensure the foregoing, a control circuit in the read amplifier should switch over to the high gain factor when the integrated input signal of the current frame drops below a lower reference value (UR) of the low amplifier stage (in voltage), or to the low gain factor when the integrated input signal of the current frame exceeds an upper reference value (OR) of the high amplifier stage (in voltage).

As appears from FIG. 2, the upper reference value (OR) of the high amplifier stage and the lower reference value (UR) of the low amplifier stage coincide (see the line denoted by the reference (R)). The lower reference value (UR) exceeds the lower limit (UG) of the local dynamic range of the amplifier (in voltage) in the low amplifier stage by an amount equal to the maximum possible relative variation ΔS/S of the integrated input signal between two successive frames. The upper limit (OG) of the local dynamic range of the amplifier (in voltage) in the high amplifier stage by an amount equal to the maximum possible relative variation ΔS/S of the integrated input signal. Consequently, the overlapping of the local dynamic ranges of the low and the high amplifier stage should correspond to at least twice the value of the maximum possible relative variation ΔS/S of the input signal.

For the present embodiment it is assumed that the maximum possible relative variation of the integrated input signal ΔS/S =5. This means that the integrated input signal has a maximum dynamic range of +/−2.3 bits between two successive frames. In the embodiment shown in FIG. 2, therefore, an overlap of 2×2.5 bits was selected, starting from the lower and the upper limit (UG/OG) of the local dynamic ranges of the low and the high gain factor, respectively.

Figure 3:
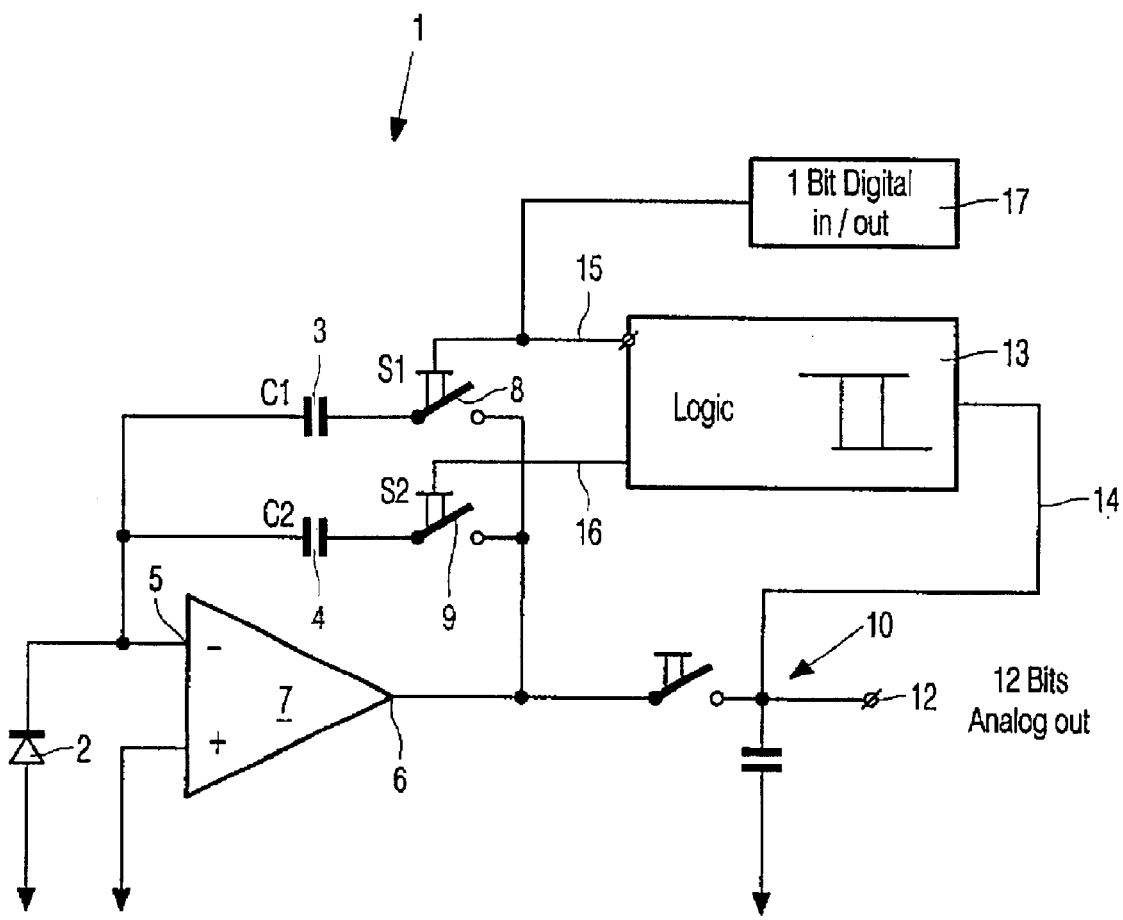
FIG. 3 shows a circuit diagram of a two-stage read amplifier with automatic control of the gain factor.

FIG. 3 shows an example of a circuit diagram for a two-stage read amplifier. The read amplifier, denoted overall by the reference 1, integrates the input signal from a photodiode 2 on feedback capacitors 3 and 4. The input signal is proportional to the number of X-ray photons. Via switches 8 and 9, the feedback capacitors are connected parallel to an inverting input 5 and an output 6 of an operational amplifier 7.

Via a further switch (not shown in FIG. 3), the feedback capacitors 3, 4 can be short-circuited in order to remove residual charges across the feedback capacitors 3 and 4 before application of an input signal from the photodiode to the input 5 of the operational amplifier 7. Integration of the charge on the feedback capacitors 3, 4 yields an output voltage which is proportional to the number of X-ray photons during a frame. The behavior of this output voltage is reciprocal to the magnitude of the feedback capacitors. Therefore, different gain factors can be realized by way of different values of the feedback capacitors.

Each frame terminates with the transfer of the output voltage to a sample-and-hold stage 10. The output voltage on the output 12 of the sample-and-hold stage 10 after a frame is a direct measure of the number of X-ray photons.

When the read amplifier 1 starts with the high gain factor, the output voltage stored in the sample-and-hold stage 10 is compared, at the end of the first frame, with the upper reference value of the amplifier stage with the high gain factor (see FIG. 2) by means of a comparison circuit which forms part of the logic circuitry which is denoted overall by the reference numeral 13. To this end, a control lead 14 is provided between the sample-and-hold stage 10 and the logic circuitry 13. If the output voltage is lower than the upper reference value, the gain factor remains the same. In that case the integrated input signal of the next frame will definitely be within the local dynamic range of the amplifier stage having the higher train factor. However, if the output voltage exceeds the upper reference value, a switching logic circuit which is also included in the logic circuitry 13 is switched, via control leads 15, 16, to the low gain factor in that one of the switches 8, 9 is opened.

If the output voltage drops below the lower reference value (see FIG. 2) of the lower gain factor, and hence also the output voltage of the sample-and-hold stage 10, the logic circuit 13 switches over to the higher gain factor again.

In addition to the analog output 12 of the sample-and-hold stage 10, the read amplifier 1 also has a digital output 17 which supplies control information concerning the selected gain factor. In the embodiment with two gain factors one control bit suffices for this purpose.

In the case of a two-stage amplifier it is merely during the first frame that it is not ensured that the input signal is resolved by the amplifier. The comparison logic circuitry will have determined the appropriate gain factor no later than in the second frame.

Even though the foregoing example relates exclusively to a-read amplifier with two gain factors, it will be evident that the invention is by no means restricted thereto. It can be readily extended to read amplifiers with more than two gain factors. In that case it must also be ensured that the respective local dynamic ranges of the individual amplifier stages (see FIG. 2) overlap. The larger number of gain factors necessitates a greater width of the digital output 17. Assuming that the read amplifier has N gain factors, the comparison logic circuitry will have adjusted the correct gain factor no later than after N−1 frames by when the lowest gain factor has been adjusted at the beginning of the exposure.

FIG. 4 shows diagrammatically a computer tomograph with a multi-line detector. In a circular portal frame or gantry 31 there are arranged the X-ray tube 32 and the multi-line detector 33 which is mounted so as to face the X-ray tube. The X-ray tube 32 projects a pyramidal X-ray beam 34 through the patient 35 and onto the multi-line detector 33. The patient 35 to be examined is displaced through the rotating gantry 31 on a support 36.

The detector array 33 is mounted at a distance r from the focus of the X-ray tube 32. During one complete revolution of the gantry 31 the X-ray beam 34 irradiates the patient 35 in the plane of the gantry from different angles φ relative to the perpendicular. A cross-sectional image 37 of the irradiated region of the patient is calculated by means of such projections.

The detector array 33 is composed of a plurality of detector elements which are arranged in a plurality of rows. These rows extend in parallel in the direction of the axis of rotation (z direction). Each detector array includes a photodiode 2 which is coupled to the read amplifier 1.

What is claimed is:

1. A computer tomograph with a charge-integrating read amplifier having a plurality of gain factors for a data acquisition system as well as a control circuit for the gain factors, wherein the control circuit automatically selects the gain factor in dependence on the expected integrated input signal of a next (second) frame of two (2) successive frames of shot data, the expectation being based on the maximum possible relative variation of the integrated input signal between said two successive frames of shot data.

2. A computer tomograph as claimed in claim 1, wherein the control circuit automatically switches over to a higher gain factor when the integrated input signal of the current frame of shot data drops below a lower reference value (UR) of a current amplifier stage, and that the control circuit automatically switches over to a lower gain factor when the integrated input signal of the current frame of shot data exceeds an upper reference value (OR) of the current amplifier stage.

3. A computer tomograph as claimed in claim 2, wherein the lower reference value (UR) for the integrated input signal exceeds the lower limit (UG) of the local dynamic range of the read amplifier with the currently selected gain factor by an amount which is at least equal to the maximum possible relative variation of the integrated input signal between two successive frames of shot data, and that the upper reference value (OR) for the integrated input signal is lower than the upper limit (OG) of the local dynamic range of the read amplifier with the currently selected gain factor by an amount which is at least equal to the maximum possible relative variation of the input signal between said two successive frames of shot data.

4. A computer tomograph as claimed in claim 2 wherein, the read amplifier includes an operational amplifier with an inverting input, a non-inverting input and an output as well as a plurality of capacitors which can be connected parallel to the operational amplifier, between the inverting input and the output of the operational amplifier, by means of switching means, the capacitors can be short-circuited for reset purposes, and the control circuit includes a comparison logic circuit and a switching logic circuit for the switching means, the comparison logic circuit comparing the integrated input signal of the read amplifier with the reference values for the relevant selected gain factor while the switching logic circuit switches over, by actuation of the switching means, to another gain factor when the integrated input signal exceeds or drops below the reference values.

5. A computer tomograph as claimed in claim 1, wherein the control circuit for the read amplifier having two gain factors consists of a threshold switch, having two stable switching states, and an inverter output.

6. A computer tomograph as claimed in claim 1, wherein the read amplifier is constructed fully in CMOS technology.

7. A computer tomograph as claimed in claim 1, wherein the read amplifier and a photosensor supplying the input signal are realized fully in CMOS technology.

8. A computer tomograph as claimed in claim 3 wherein, the read amplifier includes an operational amplifier with an inverting input, a non-inverting input and an output as well as a plurality of capacitors which can be connected parallel to the operational amplifier, between the inverting input and the output of the operational amplifier, by means of switching means, the capacitors can be short-circuited for reset purposes, and the control circuit includes a comparison logic circuit and a switching logic circuit for the switching means, the comparison logic circuit comparing the integrated input signal of the read amplifier with the reference values for the relevant selected gain factor while the switching logic circuit switches over, by actuation of the switching means, to another gain factor when the integrated input signal-exceeds or drops below the reference values.

* * * * *